United States Patent
Chen

(10) Patent No.: US 11,012,085 B1
(45) Date of Patent: May 18, 2021

(54) SCHEME FOR MITIGATING CLOCK HARMONIC INTERFERENCE AND DESENSITIZATION IN RF CHANNELS

(71) Applicant: Audiowise Technology Inc., Hsinchu (TW)

(72) Inventor: Peng-Sen Chen, Hsinchu County (TW)

(73) Assignee: Audiowise Technology Inc., Hsinchu (TW)

( * ) Notice: Subject to any disclaimer, the term of this patent is extended or adjusted under 35 U.S.C. 154(b) by 0 days.

(21) Appl. No.: 16/814,941

(22) Filed: Mar. 10, 2020

(51) Int. Cl.
| | |
|---|---|
| H03M 1/06 | (2006.01) |
| H03M 1/18 | (2006.01) |
| H03M 1/46 | (2006.01) |
| H04W 4/80 | (2018.01) |
| H03M 1/12 | (2006.01) |

(52) U.S. Cl.
CPC ............ *H03M 1/18* (2013.01); *H03M 1/123* (2013.01); *H03M 1/46* (2013.01); *H04W 4/80* (2018.02)

(58) Field of Classification Search
CPC ........ H03M 1/005; H03M 1/68; H03M 1/747; H03M 3/50; H03M 7/3022; H04B 17/11; H04B 17/13; H04B 17/14; H04B 17/19; H04B 17/21; H04B 17/318; H04B 1/034; H04B 1/40; H04B 1/403; H03L 2207/50; H03L 7/093; H03L 7/0995; H03L 7/085; H03L 7/099; H03L 7/0891; H03L 7/091; H03L 7/1976; H03L 7/0991; H03L 2207/06; H03L 7/1974; H03L 7/0992; H03L 7/18; H03L 7/0802; H03L 7/0893; H03L 7/1806; H03L 7/087; H03L 7/193; H03L 7/08; H03L 7/23; H03L 1/027; H03L 7/0816
USPC .................................................. 341/118–121
See application file for complete search history.

(56) References Cited

U.S. PATENT DOCUMENTS

| | | | | |
|---|---|---|---|---|
| 9,838,025 | B1* | 12/2017 | Deng | H03L 7/1072 |
| 2002/0173284 | A1* | 11/2002 | Forrester | H03L 1/026 |
| | | | | 455/255 |
| 2004/0232995 | A1* | 11/2004 | Thomsen | H03L 1/022 |
| | | | | 331/2 |
| 2006/0038710 | A1* | 2/2006 | Staszewski | H03M 1/005 |
| | | | | 341/143 |
| 2008/0246525 | A1* | 10/2008 | Bazes | H03K 5/02 |
| | | | | 327/178 |
| 2009/0103654 | A1* | 4/2009 | van Waasen | H04L 27/3845 |
| | | | | 375/318 |

(Continued)

*Primary Examiner* — Linh V Nguyen
(74) *Attorney, Agent, or Firm* — Winston Hsu

(57) ABSTRACT

A calibration loop method and technical solution capable of finding or searching for an optimum setting, which can be applied to mitigate or minimize clock harmonic interference, for each of different channel frequencies used by a wireless communication device such as Bluetooth device. The optimum setting for example may comprise an optimum setting of a supply voltage level provided from a voltage regulator to a frequency generating circuit such as phase-locked loop (PLL), an optimum setting of a capacitance of an adjustable capacitor circuit such as controllable switching capacitor coupled between the input of a phase frequency detector (PFD) of the PLL and the ground, or an optimum setting of a combination of the supply voltage level with capacitance of the controllable switching capacitor.

18 Claims, 7 Drawing Sheets

(56) References Cited

U.S. PATENT DOCUMENTS

| | | | |
|---|---|---|---|
| 2013/0063305 A1* | 3/2013 | Lo | H03L 1/027 |
| | | | 342/357.62 |
| 2015/0279299 A1* | 10/2015 | Liou | H03L 7/0802 |
| | | | 345/211 |
| 2015/0326161 A1* | 11/2015 | Rodriguez | H02P 9/02 |
| | | | 322/19 |
| 2017/0005853 A1* | 1/2017 | Lafuente | H04L 7/033 |
| 2018/0145696 A1* | 5/2018 | Sarda | H03L 7/0816 |
| 2019/0319582 A1* | 10/2019 | Heschl | H03L 7/0805 |

* cited by examiner

SCHEME FOR MITIGATING CLOCK HARMONIC INTERFERENCE AND DESENSITIZATION IN RF CHANNELS

BACKGROUND OF THE INVENTION

1. Field of the Invention

The invention relates to a Bluetooth receiver, and more particularly to a Bluetooth receiver apparatus and method capable of mitigating clock harmonic interference in RF channels.

2. Description of the Prior Art

Generally speaking, the developed advanced fabrication process may shrink or scale the semiconductor devices into smaller devices. However, the scaling of the semiconductor devices inevitably introduces clock harmonic interference into the radio-frequency (RF) circuit to affect/degrade the performance of RF circuit. A conventional scheme may use a large bypass capacitor or may add a guard ring circuit to avoid the clock harmonic interference, generated due to the voltage transient of a voltage level provided for a phase-locked loop (PLL), affecting the radio-frequency (RF) circuit. Such large bypass capacitor has a large capacitance of dozens of picofarads (pF) such as 60 pF and is designed to be physically disposed between the PLL and the output of a voltage regulator which generates the voltage level provided for the PLL, to isolate the voltage regulator from the RF front-end circuit, power amplifier, and the PLL's elements such as phase frequency detector (PFD) and controlled oscillator such as voltage controlled oscillator (VCO) or digitally controlled oscillator (DCO). Thus, it is necessary to further occupy a circuit area of the smaller semiconductor device to dispose such large bypass capacitor on the circuit area.

The guard ring circuit is designed to be physically disposed between some circuits of the PLL and the output of a voltage regulator which generates the voltage level provided for the PLL, to isolate the voltage regulator from the RF front-end circuit, power amplifier, and the PLL's elements such as VCO/DCO. Also, it is necessary to further occupy a circuit area of the smaller semiconductor device to dispose such guard ring circuit on the circuit area.

Both the large bypass capacitor and guard ring circuit cannot meet the requirements of the advanced fabrication process since the size of a semiconductor device is getting smaller and smaller.

SUMMARY OF THE INVENTION

Therefore one of the objectives of the invention is to provide Bluetooth receiver apparatuses and methods capable of mitigating clock harmonic interference without adding bypass capacitor(s) and without adding a guard ring area, to solve the above-mentioned problems.

According to embodiments of the invention, a Bluetooth receiver apparatus is disclosed. The apparatus comprises a radio-frequency front-end circuit, an analog-to-digital converter, a digital signal processing circuit, a voltage regulator circuit, and a frequency generating circuit. The radio-frequency front-end circuit has an input coupled to an antenna via a matching network circuit and has an output. The analog-to-digital converter has an input coupled to the output of the radio-frequency front-end circuit and has an output. The digital signal processing circuit is coupled to the output of the analog-to-digital converter, and used for generating a first dynamic control signal to a voltage regulator circuit for at least one channel frequency. The voltage regulator circuit is coupled to the digital signal processing circuit, and used for generating and adjusting a supply voltage level provided for a frequency generating circuit according to the first dynamic control signal of the digital signal processing circuit. The frequency generating circuit is coupled to the voltage regulator circuit and the radio-frequency front-end circuit, and used for generating a local oscillation frequency signal to the radio-frequency front-end circuit based on the adjusted supply voltage level of the voltage regulator circuit.

According to the embodiments, a Bluetooth receiver apparatus is disclosed. The Bluetooth receiver apparatus comprises a radio-frequency front-end circuit, an analog-to-digital converter, a digital signal processing circuit, and a frequency generating circuit. The radio-frequency front-end circuit has an input coupled to an antenna via a matching network circuit and has an output. The analog-to-digital converter has an input coupled to the output of the radio-frequency front-end circuit and has an output. The digital signal processing circuit is coupled to the output of the analog-to-digital converter, and used for generating a dynamic control signal a frequency generating circuit. The frequency generating circuit is coupled to the radio-frequency front-end circuit, and comprises a clock buffer, a phase frequency detector, and an adjustable capacitor circuit. The clock buffer is used for receiving and buffering a reference frequency signal generated from an oscillator circuit. The phase frequency detector is coupled to the clock buffer, and used for receiving the buffered reference frequency signal. The adjustable capacitor circuit has a first end coupled to an output of the clock buffer and an input of the phase frequency detector and has a second end coupled to a ground level. The digital signal processing circuit is used for generating the dynamic control signal to control and adjust a capacitance of the adjustable capacitor circuit to minimize signal energy of a specific channel frequency of a signal received from the output of the analog-to-digital converter.

According to the embodiments, a method of a Bluetooth receiver apparatus is disclosed. The method comprises: providing a radio-frequency front-end circuit having an input coupled to an antenna via an matching network circuit and having an output; providing an analog-to-digital converter having an input coupled to the output of the radio-frequency front-end circuit and having an output; generating a first dynamic control signal to a voltage regulator circuit for at least one channel frequency; using the voltage regulator circuit to generate and adjust a supply voltage level provided for a frequency generating circuit according to the first dynamic control signal; and using the frequency generating circuit to generate a local oscillation frequency signal to the radio-frequency front-end circuit based on the adjusted supply voltage level of the voltage regulator circuit.

According to the embodiments, a method used in a Bluetooth receiver apparatus is disclosed. The method comprises: providing a radio-frequency front-end circuit having an input coupled to an antenna via an matching network circuit and having an output; providing an analog-to-digital converter having an input coupled to the output of the radio-frequency front-end circuit and having an output; generating a dynamic control signal a frequency generating circuit; using the frequency generating circuit to: using a clock buffer for receiving and buffering a reference frequency signal generated from an oscillator circuit; using a phase frequency detector for receiving the buffered reference frequency signal; and providing an adjustable capacitor circuit having a first end coupled to an output of the clock buffer and an input of the phase frequency detector and having a second end coupled to a ground level. The method further comprises generating the dynamic control signal to control and adjust a capacitance of the adjustable capacitor circuit to minimize signal energy of a specific channel frequency of a signal received from the output of the analog-to-digital converter.

These and other objectives of the present invention will no doubt become obvious to those of ordinary skill in the art after reading the following detailed description of the preferred embodiment that is illustrated in the various figures and drawings.

DETAILED DESCRIPTION

The invention aims at providing a calibration loop method and technical solution capable of finding or searching for an optimum setting, which can be applied to mitigate or minimize clock harmonic interference to avoid desensitizing radio-frequency (RF) performance, for each of different channel frequencies used by a wireless communication device such as Bluetooth device wherein such optimum setting for example may comprise an optimum setting of a supply voltage level provided from a voltage regulator to a frequency generating circuit such as phase-locked loop (PLL), an optimum setting of a capacitance of an adjustable capacitor circuit such as controllable switching capacitor coupled between the input of a phase frequency detector (PFD) of the PLL and the ground, or an optimum setting of a combination of the supply voltage level with capacitance of the controllable switching capacitor.

It should be noted that, unlike the conventional large bypass capacitor having dozens of picofarads ($10^{-12}$), the adjustable capacitance range of the provided adjustable capacitor circuit for example is in a plurality of femtofarads (fF, $10^{-15}$). That is, the capacitance of the conventional large bypass capacitor may be a thousand times or several hundred times larger than that of the provided adjustable capacitor circuit. Thus, the size of the provided adjustable capacitor circuit is extremely smaller than that of the conventional large bypass capacitor mentioned above. In addition, the provided adjustable capacitor circuit is used for appropriately shifting the clock harmonic interference energy, and is not used for isolating a voltage regulator from the RF circuit and PLL's elements. In practice, one end of the provided adjustable capacitor circuit is coupled to the input of PLL's phase frequency detector and the output of a clock buffer, and the other end is coupled to the ground level.

When the Bluetooth receiver device operates at a first channel frequency, the provided solution and method can control and adjust such provided supply voltage level and/or the capacitance of controllable switching capacitor based on a first optimum setting corresponding to the first channel frequency. When the Bluetooth receiver device switches from the first channel frequency into a second channel frequency, the provided solution and method can control and adjust such provided supply voltage level and/or the capacitance of controllable switching capacitor based on a second optimum setting corresponding to the second channel frequency instead of the first optimum setting. This makes that the clock harmonic interferences can be dynamically minimized or mitigated for more or all channel frequencies without increasing too many circuit areas compared to the conventional scheme. Thus, the circuit costs can be significantly saved.

The different embodiments of the invention are provided in the following paragraphs.

Figure 1:
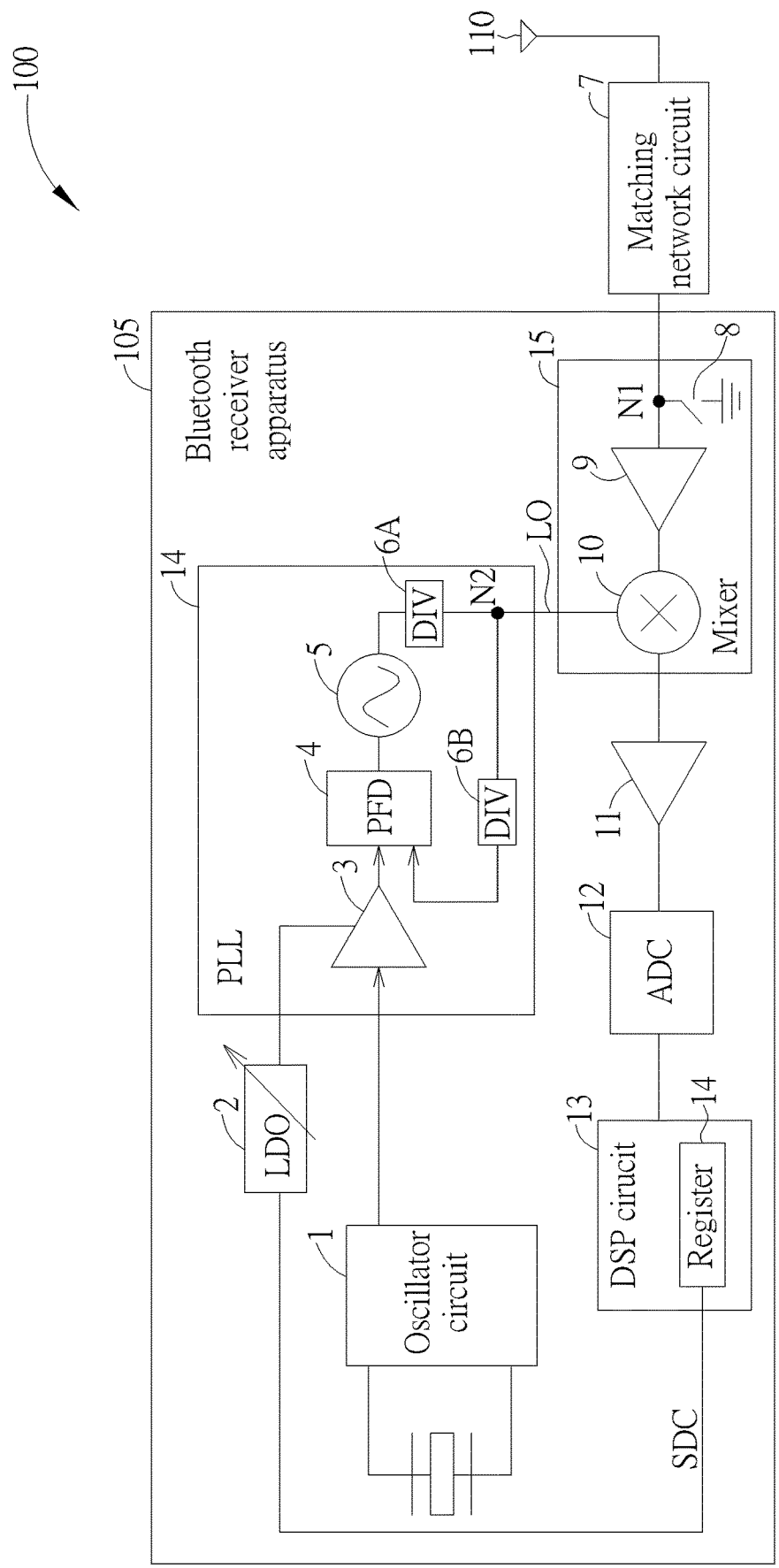
FIG. 1 is a diagram of a Bluetooth receiver apparatus capable of finding one or more optimum settings of supply voltage level for one or more channel frequencies according to one embodiment of the invention.

FIG. 1 is a diagram of a Bluetooth receiver apparatus 105 capable of finding one or more optimum settings of supply voltage level for one or more channel frequencies according to one embodiment of the invention. A Bluetooth device 100 such as a receiver device or transceiver device comprises the apparatus 105, an antenna 110, and a matching network circuit 7 wherein the apparatus 105 for example is a Bluetooth receiver circuit. The apparatus 105 comprises an oscillator circuit 1 such as quartz crystal oscillator, a voltage regulator circuit 2 such as low-dropout regulator (LDO), a frequency generating circuit such as phase-locked loop (PLL) 14, a radio-frequency (RF) front-end circuit 15, an intermediate frequency (IF) amplifier 11, an analog-to-digital converter (ADC) 12, and a digital signal processing (DSP) circuit 13. The PLL 14 comprises a clock buffer 3, a phase frequency detector (PFD) 4, a controlled oscillator 5 such as digitally controlled oscillator (DCO) or voltage controlled oscillator (VCO), and frequency dividers (DIV) 6A and 6B. The RF front-end circuit 15 comprises a switch 8, a low noise amplifier (LNA) 9, and a mixer 10. The RF front-end circuit 15 has an input coupled to the antenna 110 via the matching network circuit 115 and has an output coupled to the input of IF amplifier 11, and the circuit 15 comprises a switch 8, a low noise amplifier (LNA) 150, and a mixer 155. In other embodiments, the switch 8 may be disposed outside the RF front-end circuit 15; this also obeys the spirit of the invention.

The switch 8 has two ends wherein one end is coupled to the node N1 and the other end is coupled to the ground level. The switch 8 can be controlled by the DSP circuit 13 to be at an open state to not short the signal at the node N1 to the ground level when the Bluetooth device 100 operates under a signal reception mode wherein the Bluetooth device 100 comprise such signal reception mode and a calibration mode in which the provided calibration loop method is used to adjust the optimum setting(s) of supply voltage level for one or more channel frequencies respectively to mitigate clock harmonic interference.

The LNA 9 is used to amplify the signal at node N1 without significantly degrading its signal-to-noise ratio to generate an amplified signal to the mixer 10 whether in the signal reception mode or in calibration mode. The mixer 10 is used to perform a frequency down conversion upon the amplified signal from the LNA 9 based on a local oscillation (LO) clock signal from the node N2 so as to generate a low frequency signal such as an intermediate-frequency signal in this embodiment or a baseband signal if the mixer 10 operates based on a direct conversion scheme in other embodiments in which the IF amplifier 11 is optional.

The IF amplifier 11 is used to receive and convert the intermediate frequency signal at the intermediate frequency into a baseband signal at analog domain, and then the ADC 12 is used to convert the baseband signal at analog domain into a digital baseband signal at digital domain. The ADC 12 has an input coupled to the output of the RF front-end circuit 15 and has an output coupled to the DSP circuit 13.

The DSP circuit 13 is coupled to the output of the ADC 12 to receive the digital baseband signal, and the DSP circuit 13 operating under the signal reception mode is used to control the state of switch 8 at the open state, and thus the digital baseband signal in this situation carries the information of Bluetooth communication signals of the Bluetooth device 100. The DSP 13 processes the Bluetooth communication information to perform corresponding operations.

The DSP circuit 13 operating under the calibration mode is used to control the switch 8 at the closed state to couple the signal at node N1 into the ground level so as to short the signal at node N1 to the ground. That is, the switch 8 is used to couple and short the signal at the input of the RF front-end circuit 15 to the ground when the switch 8 is closed. In this situation, the digital baseband signal, received by the DSP circuit 13, does not carry the information of any Bluetooth communication signals that are transmitted via the antenna 110. The energy of such digital baseband signal in this situation is proportional to the energy of clock harmonic interference caused due to the transient voltage of the actually provided supply voltage level generated from the LDO 2 to the clock buffer 3 disposed within PLL 14.

The clock buffer 3 is coupled between oscillator circuit 1 between and PFD 4, and is used for receiving and buffering a reference frequency signal generated from the oscillator circuit 1. The inputs of PFD 4 are coupled to the buffered reference frequency signal and the feedback signal transmitted via the frequency divider 6B.

In this embodiment, to minimize or mitigate the clock harmonic interference for a specific channel frequency, the DSP circuit 13 operating under the calibration mode is arranged to detect the energy (e.g. power/current/voltage level) of the digital baseband signal (particularly the energy of digital baseband signal at the selected specific channel frequency) and to generate a dynamic control signal SDC to the LDO 2 based on the detected energy to control the LDO 2 dynamically adjusting or controlling its generated supply voltage level, so as to dynamically shift the clock harmonic energy to decrease or minimize the energy of the digital baseband signal feedback received when the PLL 14 operates based on the dynamically adjusted/controlled supply voltage level. That is, PLL 4 is coupled to the LDO 2 and RF front-end circuit 15 is used to generate the local oscillation (LO) frequency signal to the mixer 10 of RF front-end circuit 15 based on the dynamically adjusted supply voltage level. The provided calibration loop method is arranged to dynamically adjust the supply voltage level provided for the clock buffer 3.

In practice, the DSP circuit 13 can minimize the energy of digital baseband signal by gradually adjusting the supply voltage level provided by the LDO 2 one step by one step so as to find or search for a particular supply voltage level which can minimize the energy of digital baseband signal for the specific channel frequency. That is, the DSP circuit 13 can control the LDO 2 selecting a particular/specific supply voltage level among multiple or all candidate supply voltage levels as the optimum supply voltage level which can minimize the signal energy of the digital baseband signal at the specific channel frequency. Then the DSP circuit 13 records the found particular supply voltage level as an optimum setting for such specific channel frequency. Similarly, the DSP circuit 13 can find all optimum settings for different channel frequencies wherein the actually used supply voltage levels respectively indicated by the optimum settings corresponding to the different channel frequencies may be different from each other, at least one portion may be identical in other embodiments, or all the levels are identical in other embodiments. All the found optimum settings (i.e. control information) for different channel frequencies can be stored in the register 14 disposed within the DSP circuit 13; however, this is not intended to be a limitation.

Figure 2:
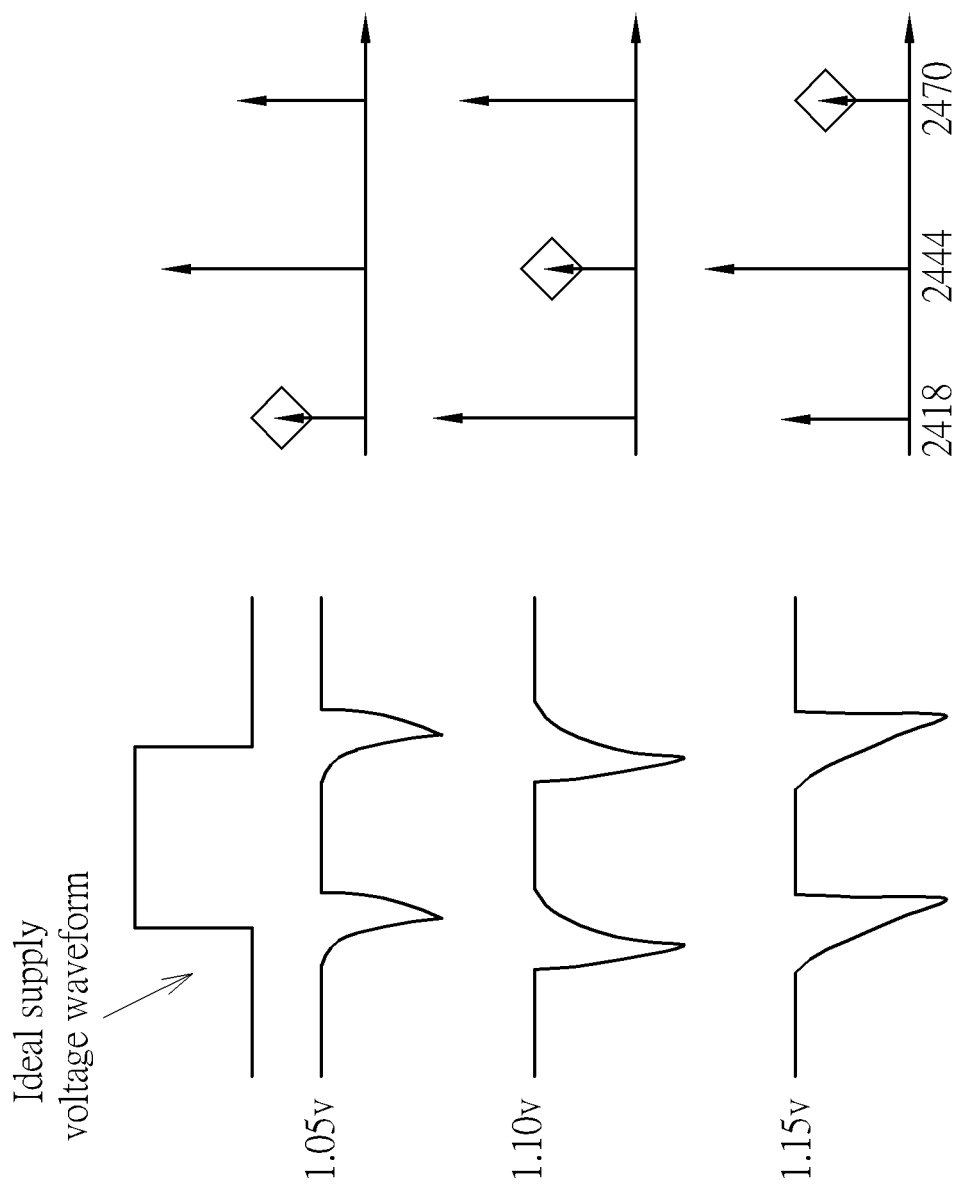
FIG. 2 is a diagram showing examples of the clock harmonic interference energy distributed or spreading on different channel frequencies when different supply voltage levels of the LDO are provided according to one embodiment of the invention.

FIG. 2 is a diagram showing examples of the clock harmonic interference energy distributed or spreading on different channel frequencies when different supply voltage levels of the LDO 2 are provided according to one embodiment of the invention. The ideal waveform of the supply voltage signal generated from the LDO 2 and the voltage transients caused by the different slightly adjusted levels 1.05 Volts, 1.1 Volts, and 1.15 Volts of the supply voltage signal generated from the LDO 2 are shown in the left side of FIG. 2, and correspondingly the clock harmonic interference energy distributed or spreading on different channel frequencies 2418 MHz, 2444 MHz, and 2470 MHz are shown in the right side of FIG. 2. As shown in FIG. 2, for the channel frequency of 2418 MHz, the energy of clock harmonic interference generated at 2418 MHz due to the voltage transient is smallest, i.e. a minimum value, if the supply voltage level actually provide by the LDO 2 for the clock buffer 3 is equal to 1.05 Volts. The DSP circuit 13 can dynamically control the LDO 2 to search for different voltages to find 1.05 Volts and finally determining 1.05 Volts as the optimum setting of the supply voltage level corresponding to the channel frequency of 2418 MHz. The value of 1.05 Volts is recorded by the DSP circuit 13 into the register 14. For the channel frequency of 2444 MHz, the energy of clock harmonic interference generated at 2444 MHz due to the voltage transient is smallest, i.e. a minimum value, if the supply voltage level actually provide by the LDO 2 for the clock buffer 3 is equal to 1.1 Volts. The DSP circuit 13 can dynamically control the LDO 2 to search for different voltages to find 1.1 Volts and finally determining 1.1 Volts as the optimum setting of the supply voltage level corresponding to the channel frequency of 2444 MHz. The value of 1.1 Volts is recorded by the DSP circuit 13 into the register 14. For the channel frequency of 2470 MHz, the energy of clock harmonic interference generated at 2470 MHz due to the voltage transient is smallest, i.e. a minimum value, if the supply voltage level actually provide by the LDO 2 for the clock buffer 3 is equal to 1.15 Volts. The DSP circuit 13 can dynamically control the LDO 2 to search for different voltages to find 1.15 Volts and finally determining 1.15 Volts as the optimum setting of the supply voltage level corresponding to the channel frequency of 2470 MHz. The value of 1.15 Volts is recorded by the DSP circuit 13 into the register 14.

Figure 3:
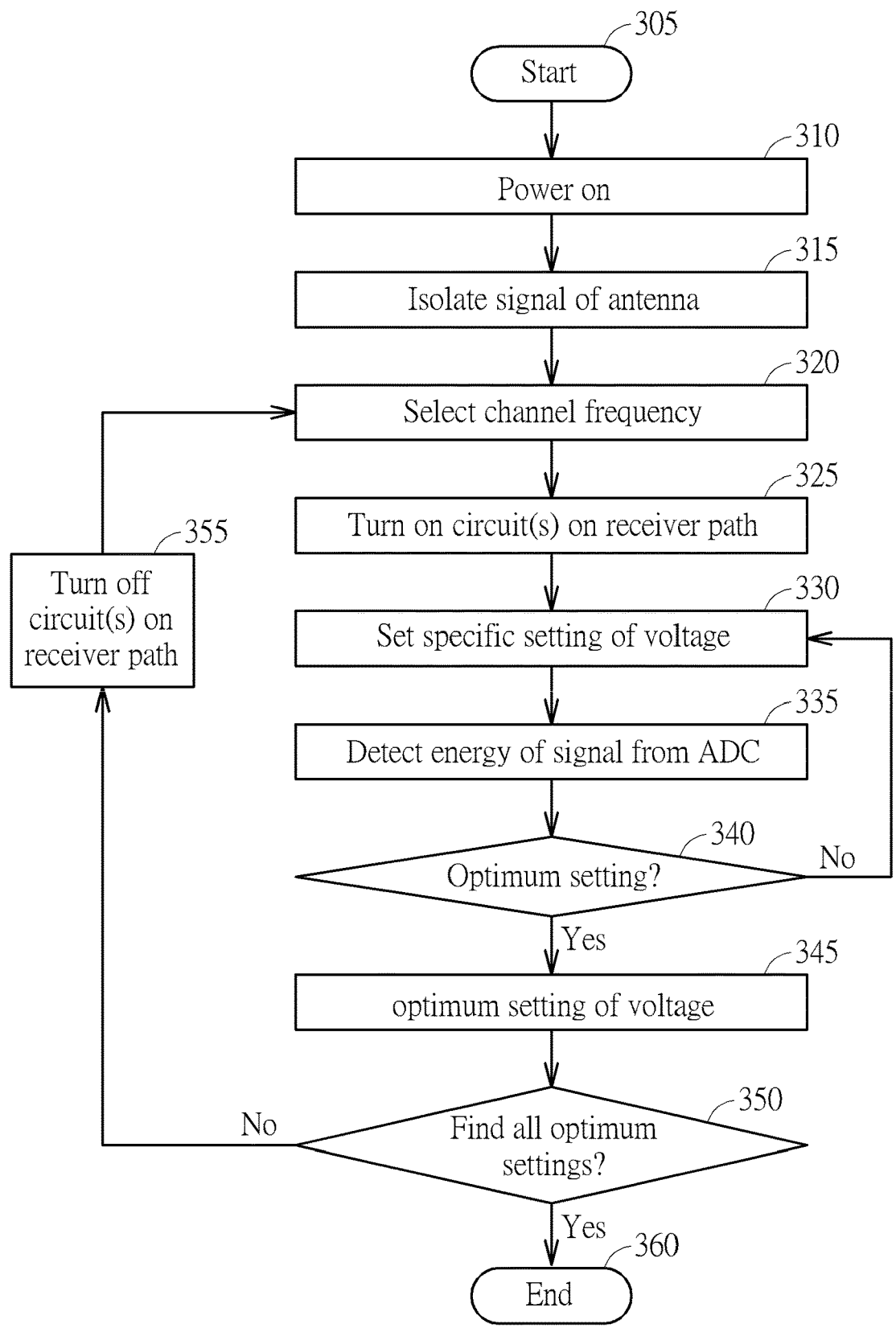
FIG. 3 is a flowchart diagram of a method of the operation of Bluetooth receiver apparatus according to one embodiment of the invention.

FIG. 3 is a flowchart diagram of a method of the operation of Bluetooth receiver apparatus 105 according to one embodiment of the invention. Provided that substantially the same result is achieved, the steps of the flowchart shown in FIG. 3 need not be in the exact order shown and need not be contiguous, that is, other steps can be intermediate. Steps are detailed in the following:

Step 305: Start;

Step 310: Bluetooth receiver apparatus 105 is powered on wherein for example at least the DSP circuit 13 is powered on;

Step 315: DSP circuit 13 controls the switch 8 at the closed state to short the signal at input of the RF front-end circuit 15 into the ground level so as to isolate the signal received from the antenna 110 from the RF front-end circuit 15;

Step 320: Bluetooth receiver apparatus 105 selects a specific channel frequency and operates at the specific channel frequency;

Step 325: Turn on the power of circuit(s) disposed on the receiver path wherein the LNA 9, mixer 10, ADC 12, oscillator circuit 1, LDO 2, and/or PLL 14 is/are powered on;

Step 330: DSP circuit 13 sets a specific setting corresponding to a specific supply voltage level provided for the PLL 14;

Step 335: DSP circuit 13 detects the energy of the digital baseband signal generated from the ADC 12 after the circuits disposed on the receiver path employ the LO clock signal which is generated based on the specific supply voltage level;

Step 340: DSP circuit 13 determines whether an optimum setting of the supply voltage level for the specific channel frequency is found wherein the optimum setting corresponds to the smaller or smallest energy of the digital baseband signal; if the optimum setting is found, then the flow proceeds to Step 345, otherwise, the flow proceeds to Step 330 to select other different channel frequency(s);

Step 345: DSP circuit 13 records the optimum setting of the supply voltage level for the specific channel frequency at the register 14;

Step 350: DSP circuit 13 determines whether the optimum settings of all channel frequencies are determined or found; if the optimum settings of all channel frequencies are determined, then the flow proceeds to Step 360, otherwise, the flow proceeds to Step 355 to find the optimum setting(s) of other channel frequency(s);

Step 355: Turn off the power of circuit(s) disposed on the receiver path for other channel frequency(s); and Step 360: End.

It should be noted that the power of circuit(s) disposed on the receiver path of Bluetooth device 100 is turn off and then turn on each time when the optimum setting for a channel frequency has been found and then the operation for determining the optimum setting for another different channel frequency will be performed, so as to avoid voltage transient influencing the performance of the operation of determining the optimum settings for different channel frequencies.

That is, if an external measurement device is employed to measure the current/power provided for the Bluetooth device 100 (or for Bluetooth receiver apparatus 105), a measured current/power may be switched from a high level to a low level due to that the power of circuit(s) disposed on the receiver path of Bluetooth device 100 is turn off and then may be switched from the low level to the high level due to that the power of circuit(s) disposed on the receiver path of Bluetooth device 100 is turn on. Similarly, if a spectrum analyzer device is employed to measure the spectrum of the input signal at the input of Bluetooth device 100 (or Bluetooth receiver apparatus 105), a measured spectrum may indicate a dynamic change which is caused due to that the power of circuit(s) disposed on the receiver path of Bluetooth device 100 is turn off and then turn on.

In addition, the disposed circuits may comprise the LNA 9, mixer 10, ADC 12, oscillator circuit 1, LDO 2, and/or PLL 14. However, this is not meant to be a limitation. In other embodiments, if the requirement of improved performance is not considered, then the power of circuit(s) disposed on the receiver path of Bluetooth device 100 may be not turn off and then turn on when the optimum setting for a channel frequency has been found and then the operation for determining the optimum setting for another different channel frequency will be performed. In addition, which circuits disposed on the receiver path of Bluetooth device 100 is not intended to be a limitation.

Figure 4:
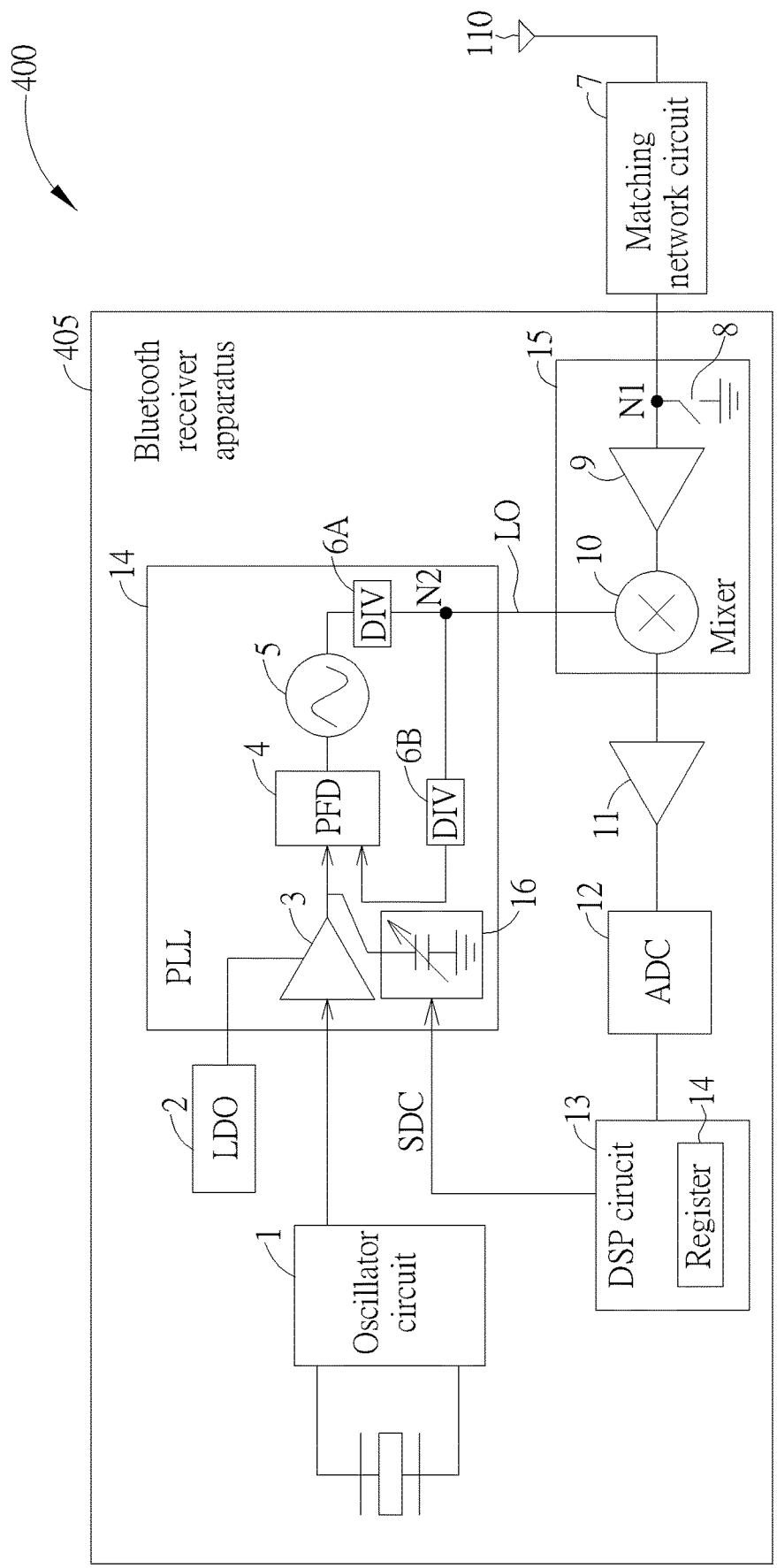
FIG. 4 is a diagram of a Bluetooth receiver apparatus capable of finding one or more optimum settings of supply voltage level for one or more channel frequencies according to another embodiment of the invention.

FIG. 4 is a diagram of a Bluetooth receiver apparatus 405 capable of finding one or more optimum settings of supply voltage level for one or more channel frequencies according to another embodiment of the invention. A Bluetooth device 400 such as a receiver device or transceiver device comprises the apparatus 405, antenna 110, and matching network circuit 7 wherein the apparatus 405 for example is a Bluetooth receiver circuit. The apparatus 405 comprises the oscillator circuit 1, LDO 2, PLL 14, RF front-end circuit 15, IF amplifier 11, ADC 12, DSP circuit 13, and further comprises a controllable switching capacitor 16.

In this embodiment, to minimize or mitigate the clock harmonic interference for a specific channel frequency, the DSP circuit 13 operating under the calibration mode is arranged to detect the energy (e.g. power/current/voltage level) of the digital baseband signal sent from the ADC 12 and to generate a dynamic control signal SDC to the LDO 2 based on the detected energy to dynamically adjust or control the capacitance of the controllable switching capacitor 16 so as to dynamically shift the clock harmonic energy to decrease or minimize the energy of the digital baseband signal feedback received when the PLL 14 operates based on the dynamically adjusted/controlled supply voltage level. That is, the provided calibration loop method is arranged to dynamically adjust the capacitance of the controllable switching capacitor 16 without adjusting the supply voltage level provided for the clock buffer 3; in this embodiment such provided supply voltage level may be fixed for all channel frequencies. In practice, the DSP circuit 13 can minimize the energy of digital baseband signal by gradually adjusting the capacitance of the controllable switching capacitor 16 one step by one step so as to find or search for a particular capacitance which can minimize the energy of digital baseband signal for a selected specific channel frequency. Then the DSP circuit 13 records the found capacitance as an optimum setting for such selected specific channel frequency. Similarly, the DSP circuit 13 can find all optimum settings for different channel frequencies wherein the actually used capacitances respectively indicated by the optimum settings corresponding to the different channel frequencies may be different from each other, at least one portion may be identical in other embodiments, or all the capacitance are identical in other embodiments. All the found optimum settings for different channel frequencies can be stored in the register 14 disposed within the DSP circuit 13; however, this is not intended to be a limitation.

Figure 5:
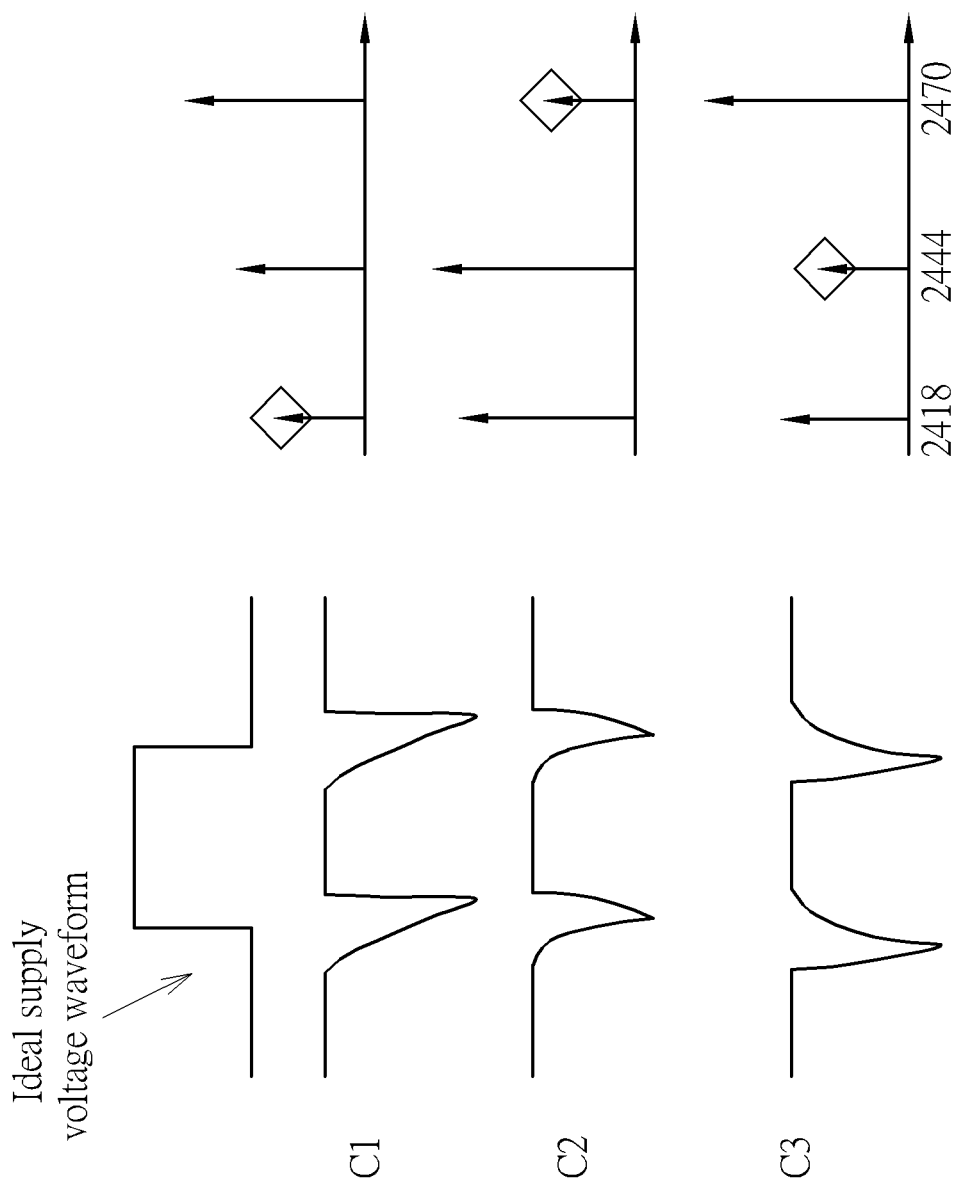
FIG. 5 is a diagram showing examples of the clock harmonic interference energy distributed or spreading on different channel frequencies when different capacitances of the controllable switching capacitor are used according to one embodiment of the invention.

FIG. 5 is a diagram showing examples of the clock harmonic interference energy distributed or spreading on different channel frequencies when different capacitances of the controllable switching capacitor 16 are used according to one embodiment of the invention. The ideal waveform of the supply voltage signal generated from the LDO 2 and the voltage transients caused by the different capacitances C1, C2, and C3 are shown in the left side of FIG. 5, and correspondingly the clock harmonic interference energy distributed or spreading on different channel frequencies 2418 MHz, 2444 MHz, and 2470 MHz are shown in the right side of FIG. 5.

As shown in FIG. 5, for the channel frequency 2418 MHz, the energy of clock harmonic interference generated at 2418 MHz due to the voltage transient is smallest, i.e. a minimum value, if the capacitance of the controllable switching capacitor 16 is adjusted to C1. In practice, the DSP circuit 13 can dynamically control the controllable switching capacitor 16 to search for different capacitances in an adjustable capacitance range to find the capacitance C1 and finally determining capacitance C1 as the optimum setting of the capacitance of the controllable switching capacitor 16 for the channel frequency 2418 MHz. The capacitance C1 is then recorded by the DSP circuit 13 into the register 14.

For the channel frequency 2444 MHz, the energy of clock harmonic interference generated at 2444 MHz due to the voltage transient is smallest, i.e. a minimum value, if the capacitance of controllable switching capacitor 16 is adjusted to C2. In practice, the DSP circuit 13 can dynamically control the controllable switching capacitor 16 to search for different capacitances in the adjustable capacitance range to find the capacitance C2 and finally determining capacitance C2 as the optimum setting of the capacitance of the controllable switching capacitor 16 for the channel frequency 2444 MHz. The capacitance C2 is then recorded by the DSP circuit 13 into the register 14.

For the channel frequency 2470 MHz, the energy of clock harmonic interference generated at 2470 MHz due to the voltage transient is smallest, i.e. a minimum value, if the capacitance of controllable switching capacitor 16 is adjusted to C3. In practice, the DSP circuit 13 can dynamically control the controllable switching capacitor 16 to search for different voltages in the adjustable capacitance range to find capacitance C3 and finally determining the capacitance C3 as the optimum setting of the capacitance of the controllable switching capacitor 16 for the channel frequency 2470 MHz. The capacitance C3 is then recorded by the DSP circuit 13 into the register 14.

Figure 6:
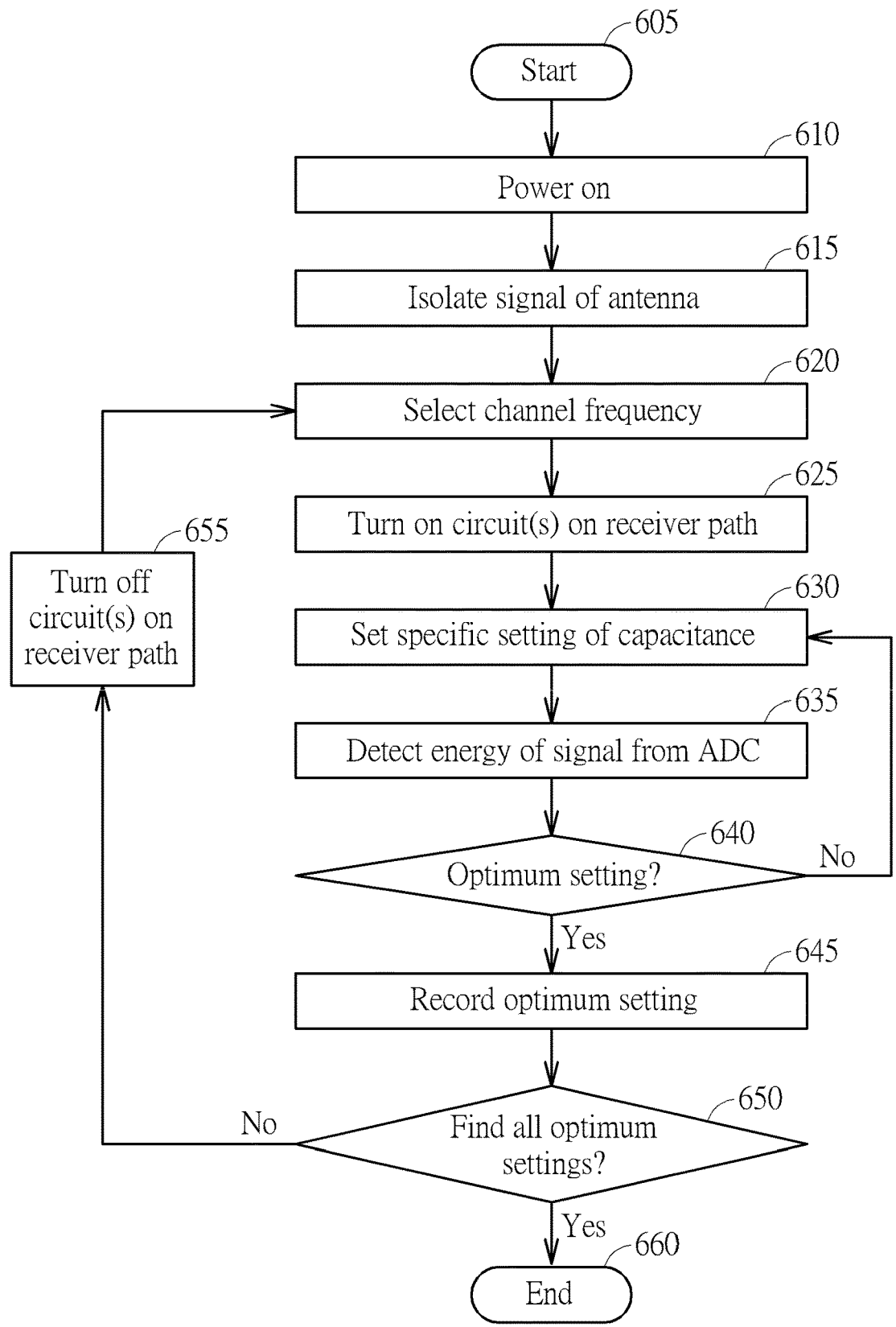
FIG. 6 is a flowchart diagram of a method of the operation of Bluetooth receiver apparatus according to one embodiment of the invention.

FIG. 6 is a flowchart diagram of a method of the operation of Bluetooth receiver apparatus 405 according to one embodiment of the invention. Provided that substantially the same result is achieved, the steps of the flowchart shown in FIG. 6 need not be in the exact order shown and need not be contiguous, that is, other steps can be intermediate. Steps are detailed in the following:

Step 605: Start;

Step 610: Bluetooth receiver apparatus 405 is powered on wherein for example at least the DSP circuit 13 is powered on;

Step 615: DSP circuit 13 controls the switch 8 at the closed state to short the signal at input of the RF front-end circuit 15 into the ground level so as to isolate the signal received from the antenna 110 from the RF front-end circuit 15;

Step 620: Bluetooth receiver apparatus 405 selects a specific channel frequency and operates at the specific channel frequency;

Step 625: Turn on the power of circuit(s) disposed on the receiver path wherein the LNA 9, mixer 10, ADC 12, oscillator circuit 1, LDO 2, and/or PLL 14 is/are powered on;

Step 630: DSP circuit 13 sets a specific setting corresponding to a specific capacitance of the controllable switching capacitor 16;

Step 635: DSP circuit 13 detects the energy of the digital baseband signal generated from the ADC 12 after the capacitance of the controllable switching capacitor 16 is adjusted to such specific capacitance;

Step 640: DSP circuit 13 determines whether an optimum setting of the capacitance for the specific channel frequency is found wherein the optimum setting corresponds to the smaller or smallest energy of the digital baseband signal; if the optimum setting is found, then the flow proceeds to Step 645, otherwise, the flow proceeds to Step 630 to select other different channel frequency(s);

Step 645: DSP circuit 13 records the optimum setting of the capacitance for the specific channel frequency at the register 14;

Step 650: DSP circuit 13 determines whether the optimum settings of all channel frequencies are determined or found; if the optimum settings of all channel frequencies are determined, then the flow proceeds to Step 660, otherwise, the flow proceeds to Step 655 to find the optimum setting(s) of other channel frequency(s);

Step 655: Turn off the power of circuit(s) disposed on the receiver path for other channel frequency(s); and Step 660: End.

Figure 7:
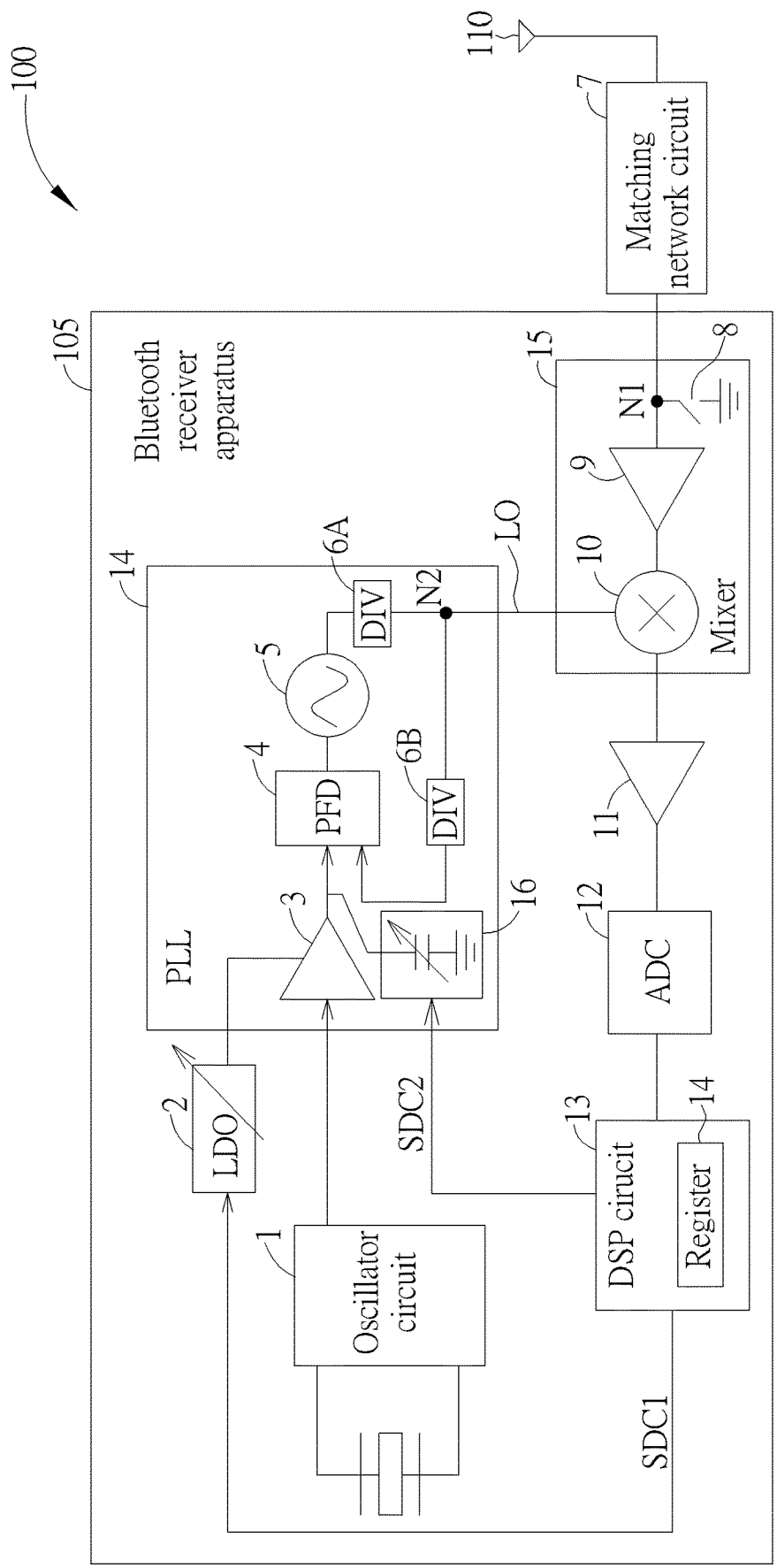
FIG. 7 is a diagram of a Bluetooth receiver apparatus according to another embodiment of the invention.

FIG. 7 is a diagram of a Bluetooth receiver apparatus 105 according to another embodiment of the invention. The Bluetooth receiver apparatus 105 further comprises the controllable switching capacitor 16. In this embodiment, to minimize or mitigate the clock harmonic interference for a specific channel frequency, the DSP circuit 13 operating under the calibration mode is arranged to detect the energy (e.g. power/current/voltage level) of the digital baseband signal sent from the ADC 12 and to generate dynamic control signals SDC1 and SDC2 to respectively control the LDO 2 and controllable switching capacitor 16 based on the detected energy to dynamically adjust or control the supply voltage level actually provided from the LDO 2 as well as the capacitance of the controllable switching capacitor 16, so as to dynamically shift the clock harmonic energy to decrease or minimize the energy of the digital baseband signal feedback received. That is, the provided calibration loop method is arranged to simultaneously and dynamically adjust the capacitance of the controllable switching capacitor 16 and the supply voltage level provided for the clock buffer 3. The DSP circuit 13 may minimize the energy of digital baseband signal by gradually adjusting the capacitance of the controllable switching capacitor 16 one step by one step and simultaneously gradually adjusting the supply voltage level of LDO 2 one step by one step so as to find or search for a particular combination of capacitance with supply voltage level which can minimize the energy of digital baseband signal for a selected specific channel frequency. Then the DSP circuit 13 records the found particular combination of capacitance with supply voltage level as an optimum setting for such selected specific channel frequency. Similarly, the DSP circuit 13 can find all optimum settings for different channel frequencies wherein the actually used combinations of capacitances with supply voltage levels respectively indicated by the optimum settings corresponding to the different channel frequencies may be different from each other, at least one portion may be identical in other embodiments, or all the capacitance are identical in other embodiments. All the found optimum settings for different channel frequencies can be stored in the register 14 disposed within the DSP circuit 13.

It should be noted that the optimum settings of supply voltage level, capacitance, and a combination of supply voltage level with capacitance for all different channel frequencies can be found and stored in the register 14 within the DSP circuit 13 after the operation of the above-mentioned calibration loop method is completed. When the Bluetooth device 100/400 operates at a specific channel frequency under the signal reception mode, the DSP circuit 13 can be arranged to generate and send corresponding control signal(s) to control the supply voltage level and/or the capacitance to mitigate or minimize the clock harmonic interference at the specific channel frequency. Accordingly, the performance of signal reception at the operated channel frequency can be significantly improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A Bluetooth receiver apparatus, comprising:
   a radio-frequency front-end circuit, having an input coupled to an antenna via a matching network circuit and having an output;
   an analog-to-digital converter, having an input coupled to the output of the radio-frequency front-end circuit and having an output;
   a digital signal processing circuit, coupled to the output of the analog-to-digital converter, for generating a first dynamic control signal to a voltage regulator circuit for at least one channel frequency;
   the voltage regulator circuit, coupled to the digital signal processing circuit, for generating and adjusting a supply voltage level provided for a frequency generating circuit according to the first dynamic control signal of the digital signal processing circuit; and
   the frequency generating circuit, coupled to the voltage regulator circuit and the radio-frequency front-end circuit, for generating a local oscillation frequency signal to the radio-frequency front-end circuit based on the adjusted supply voltage level of the voltage regulator circuit.

2. The Bluetooth receiver apparatus of claim 1, wherein the digital signal processing circuit is used to detect signal energy of the at least one channel frequency of a signal received from the output of the analog-to-digital converter to generate the first dynamic control signal to the voltage regulator circuit.

3. The Bluetooth receiver apparatus of claim 1, wherein the digital signal processing circuit is used to generate the first dynamic control signal to control the voltage regulator circuit to generate a first supply voltage and a second supply voltage to the frequency generating circuit respectively for a first channel frequency and a second channel frequency; the first supply voltage corresponding to the first channel frequency is different from the second supply voltage corresponding to the second channel frequency.

4. The Bluetooth receiver apparatus of claim 1, wherein the digital signal processing circuit is used to control the voltage regulator circuit selecting a specific supply voltage among multiple candidate supply voltages as the supply voltage level provided for the frequency generating circuit to minimize signal energy of a specific channel frequency of a signal received from the output of the analog-to-digital converter.

5. The Bluetooth receiver apparatus of claim 1, wherein the digital signal processing circuit comprises a register circuit used for recording different control information of different channel frequencies; the digital signal processing circuit is used to refer to the different control information to control the voltage regulator circuit generating and adjusting the supply voltage level provided to the frequency generating circuit respectively for the different channel frequencies.

6. The Bluetooth receiver apparatus of claim 2, wherein the digital signal processing circuit is used to control and make an input of the radio-frequency front-end circuit be coupled to a ground level to isolate the input of the radio-frequency front-end circuit from a signal received by the antenna.

7. The Bluetooth receiver apparatus of claim 1, wherein the frequency generating circuit comprises:
   a clock buffer, for receiving and buffering a reference frequency signal generated from an oscillator circuit;
   a phase frequency detector, coupled to the clock buffer, for receiving the buffered reference frequency signal; and
   an adjustable capacitor circuit, having a first end coupled to an output of the clock buffer and an input of the phase frequency detector and having a second end coupled to a ground level;
   wherein the digital signal processing circuit is used for generating a second dynamic control signal to control and adjust a capacitance of the adjustable capacitor circuit to minimize signal energy of a specific channel frequency of a signal received from the output of the analog-to-digital converter.

8. The Bluetooth receiver apparatus of claim 7, wherein the digital signal processing circuit is used to adjust the capacitance of the adjustable capacitor circuit as a first capacitance corresponding to a first channel frequency and a second capacitance corresponding to a second channel frequency respectively, and the first capacitance is different from the second capacitance.

9. A Bluetooth receiver apparatus, comprising:
   a radio-frequency front-end circuit, having an input coupled to an antenna via a matching network circuit and having an output;
   an analog-to-digital converter, having an input coupled to the output of the radio-frequency front-end circuit and having an output;
   a digital signal processing circuit, coupled to the output of the analog-to-digital converter, for generating a dynamic control signal a frequency generating circuit; and
   the frequency generating circuit, coupled to the radio-frequency front-end circuit, comprising:
      a clock buffer, for receiving and buffering a reference frequency signal generated from an oscillator circuit;
      a phase frequency detector, coupled to the clock buffer, for receiving the buffered reference frequency signal; and
      an adjustable capacitor circuit, having a first end coupled to an output of the clock buffer and an input of the phase frequency detector and having a second end coupled to a ground level;

wherein the digital signal processing circuit is used for generating the dynamic control signal to control and adjust a capacitance of the adjustable capacitor circuit to minimize signal energy of a specific channel frequency of a signal received from the output of the analog-to-digital converter.

10. A method of a Bluetooth receiver apparatus, comprising:
providing a radio-frequency front-end circuit having an input coupled to an antenna via a matching network circuit and having an output;
providing an analog-to-digital converter having an input coupled to the output of the radio-frequency front-end circuit and having an output;
generating a first dynamic control signal to a voltage regulator circuit for at least one channel frequency;
using the voltage regulator circuit to generate and adjust a supply voltage level provided for a frequency generating circuit according to the first dynamic control signal; and
using the frequency generating circuit to generate a local oscillation frequency signal to the radio-frequency front-end circuit based on the adjusted supply voltage level of the voltage regulator circuit.

11. The method of claim 10, further comprising:
detecting signal energy of the at least one channel frequency of a signal received from the output of the analog-to-digital converter to generate the first dynamic control signal to the voltage regulator circuit.

12. The method of claim 10, further comprising:
generating the first dynamic control signal to control the voltage regulator circuit to generate a first supply voltage and a second supply voltage to the frequency generating circuit respectively for a first channel frequency and a second channel frequency; the first supply voltage corresponding to the first channel frequency is different from the second supply voltage corresponding to the second channel frequency.

13. The method of claim 10, further comprising:
controlling the voltage regulator circuit selecting a specific supply voltage among multiple candidate supply voltages as the supply voltage level provided for the frequency generating circuit to minimize signal energy of a specific channel frequency of a signal received from the output of the analog-to-digital converter.

14. The method of claim 10, further comprising:
providing a register circuit used for recording different control information of different channel frequencies; and
referring to the different control information to control the voltage regulator circuit generating and adjusting the supply voltage level provided to the frequency generating circuit respectively for the different channel frequencies.

15. The method of claim 11, further comprising:
controlling and making an input of the radio-frequency front-end circuit be coupled to a ground level to isolate the input of the radio-frequency front-end circuit from a signal received by the antenna.

16. The method of claim 10, wherein the frequency generating circuit comprises:
a clock buffer, for receiving and buffering a reference frequency signal generated from an oscillator circuit;
a phase frequency detector, coupled to the clock buffer, for receiving the buffered reference frequency signal; and
an adjustable capacitor circuit, having a first end coupled to an output of the clock buffer and an input of the phase frequency detector and having a second end coupled to a ground level; and
the method further comprises:
generating a second dynamic control signal to control and adjust a capacitance of the adjustable capacitor circuit to minimize signal energy of a specific channel frequency of a signal received from the output of the analog-to-digital converter.

17. The method of claim 16, further comprising:
adjusting the capacitance of the adjustable capacitor circuit as a first capacitance corresponding to a first channel frequency and a second capacitance corresponding to a second channel frequency respectively, and the first capacitance is different from the second capacitance.

18. A method used in a Bluetooth receiver apparatus, comprising:
providing a radio-frequency front-end circuit having an input coupled to an antenna via a matching network circuit and having an output;
providing an analog-to-digital converter having an input coupled to the output of the radio-frequency front-end circuit and having an output;
generating a dynamic control signal a frequency generating circuit;
using the frequency generating circuit to:
using a clock buffer for receiving and buffering a reference frequency signal generated from an oscillator circuit;
using a phase frequency detector for receiving the buffered reference frequency signal; and
providing an adjustable capacitor circuit having a first end coupled to an output of the clock buffer and an input of the phase frequency detector and having a second end coupled to a ground level; and
generating the dynamic control signal to control and adjust a capacitance of the adjustable capacitor circuit to minimize signal energy of a specific channel frequency of a signal received from the output of the analog-to-digital converter.

* * * * *